(12) United States Patent
Kuo et al.

(10) Patent No.: US 8,669,924 B2
(45) Date of Patent: Mar. 11, 2014

(54) AMOLED DISPLAY WITH OPTICAL FEEDBACK COMPENSATION

(75) Inventors: Tzu-Yin Kuo, Hsinchu (TW); Tsung-Ting Tsai, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 542 days.

(21) Appl. No.: 12/722,040

(22) Filed: Mar. 11, 2010

(65) Prior Publication Data
US 2011/0221720 A1 Sep. 15, 2011

(51) Int. Cl.
*G06F 3/038* (2013.01)

(52) U.S. Cl.
USPC .............................. 345/82; 345/206

(58) Field of Classification Search
USPC .............. 345/81, 206, 207; 313/504
See application file for complete search history.

(56) References Cited

U.S. PATENT DOCUMENTS

| | | | |
|---|---|---|---|
| 7,061,452 B2 | 6/2006 | Inoue et al. | |
| 7,064,733 B2 * | 6/2006 | Cok et al. | 345/76 |
| 7,790,487 B2 | 9/2010 | Shih et al. | |
| 2001/0028060 A1 | 10/2001 | Yamazaki et al. | |
| 2002/0047550 A1 * | 4/2002 | Tanada | 315/155 |
| 2004/0031966 A1 | 2/2004 | Forrest et al. | |
| 2006/0097296 A1 | 5/2006 | Nam | |
| 2007/0205420 A1 * | 9/2007 | Ponjee et al. | 257/80 |
| 2007/0257250 A1 | 11/2007 | Tseng et al. | |
| 2008/0024476 A1 * | 1/2008 | Choi et al. | 345/207 |

FOREIGN PATENT DOCUMENTS

| TW | 573144 B | 1/2004 |
|---|---|---|
| TW | 200603050 | 1/2006 |
| TW | 200947683 A | 11/2009 |

OTHER PUBLICATIONS

Jiangeng Xue et al., Organic optical bistable switch, Applied Physics Letters, 2003, P136-138, vol. 82, No. 1.

\* cited by examiner

*Primary Examiner* — Amr Awad
*Assistant Examiner* — Randal Willis
(74) *Attorney, Agent, or Firm* — Morris Manning & Martin LLP; Tim Tingkang Xia, Esq.

(57) ABSTRACT

In one aspect, the present invention relates to a display. In one embodiment, the display has a substrate, and a plurality of pixels formed on the substrate and arranged in an array. Each pixel includes a driving transistor and a read-out transistor spatially formed on the substrate, where each transistor has a gate electrode, a drain electrode and a source electrode, an organic light emitting diode (OLED) having a cathode layer, a anode layer and an emissive layer formed between the cathode layer and the anode layer, and formed over the driving transistor and the read-out transistor such that the anode layer of the OLED is electrically connected to the source electrode of the driving transistor, and a photo sensor having a photosensitive layer formed between the anode layer of the OLED and the source electrode of the read-out transistor.

18 Claims, 11 Drawing Sheets

AMOLED DISPLAY WITH OPTICAL FEEDBACK COMPENSATION

FIELD OF THE INVENTION

The present invention relates generally to an organic light emitting diode (OLED) display, and more particularly, to an active matrix organic light emitting diode (AMOLED) display having each pixel structure incorporated with a photo sensor for optical feedback compensation so as to improve the performance of the AMOLED display.

BACKGROUND OF THE INVENTION

Organic light emitting diode (OLED) panel has a faster response, lighter weight, lesser viewing angle restrictions and greater contrast compared with a liquid crystal display panel, and thus has drawn great attention of the display industry. The OLED panel can be classified as a passive matrix organic light emitting diode (PMOLED) panel or an active matrix organic light emitting diode (AMOLED) panel. Generally, the AMOLED panel is particularly adapted to the production of high resolution and large size display panels.

The brightness of a pixel in the AMOLED panel is proportional to the conducting current of the organic light emitting diode and the conducting current is decided by thin film transistors (TFTs). In other words, the emission property, such as brightness and uniformity of emitted light, of the AMOLED is very sensitive to the performance of the TFTs.

Particularly, for an AMOLED display panel having a low-temperature polysilicon (LTPS) backplane crystallized by the excimer laser anneling (ELA), crystallization and non-uniformity of defeats may result in a line mura effect in the display panel, as shown in FIG. 1. The mura defects are defects that exhibit as non-uniform contract regions on OLED display pane and are attributed to pulse-to-pulse variations in the laser beam energy that is used to crystallize the amorphous silicon film. These defects are more pronounced when a constant gray value image or pattern is displayed. In AMOLED display panels, the laser annal irradiation of the non-TFT regions, such as the OLED circuit portion, on the TFT back panel often results in line-shaped mura defects. The non-uniform laser beam energy caused by pulse-to-pulse variations in the laser beam energy results in a non-uniform performance of polycrystalline silicon. Since the TFT characteristic is sensitive to the performance of the polycrystalline silicon, and the TFT devices drive the OLED devices, the non-uniform TFT characteristics result in non-uniformity in OLED's brightness. This non-uniformity causes the line mura defects, which deteriorate the display quality of the AMOLED display panel.

Therefore, a heretofore unaddressed need exists in the art to address the aforementioned deficiencies and inadequacies.

SUMMARY OF THE INVENTION

In one aspect, the present invention relates to a display. In one embodiment, the display has a substrate, and a plurality of pixels formed on the substrate and arranged in an array. Each pixel includes a driving transistor and a read-out transistor spatially formed on the substrate, where each transistor has a gate electrode, a drain electrode and a source electrode, an organic light emitting diode (OLED) having a cathode layer, a anode layer and an emissive layer formed between the cathode layer and the anode layer, and formed over the driving transistor and the read-out transistor such that the anode layer of the OLED is electrically connected to the source electrode of the driving transistor, and a photo sensor having a photosensitive layer formed between the anode layer of the OLED and the source electrode of the read-out transistor.

The anode layer of the OLED is formed such that at least a portion that overlaps the photosensitive layer of the photo sensor is partially transparent to light emitted from the emissive layer of the OLED. The photo sensor is adapted for measuring brightness of an ambient light that is proportional to light emitted from the OLED and generating a sensing signal corresponding to the measured brightness of the ambient light, wherein the sensing signal is utilized to adjust a driving voltage of the OLED accordingly.

The OLED includes a top-emitting OLED or a bottom-emitting OLED. In one embodiment, the photosensitive layer defines a photo sensing area, where the photo sensing area for the top-emitting OLED is larger than that for bottom-emitting OLED. In one embodiment, the photosensitive layer is formed of a Si-rich dielectric material.

In one embodiment, each of the driving transistor and the read-out transistor comprises an NMOS transistor or PMOS transistor. Each of the driving transistor and the read-out transistor comprises a back channel etched (BCE) type thin film transistor (TFT), an IS type TFT, a coplanar type TFT, a bottom-gate type TFT, or a top-gate type TFT.

In another aspect, the present invention relates to a display. In one embodiment, the display has an active matrix organic light emitting diode (AMOLED) panel having a plurality of pixel arranged in an array. Each pixel includes an OLED having a cathode electrically coupled to a first supply voltage, OVSS, a anode and an emissive layer formed between the cathode and the anode, and a driving circuit having a first transistor having a gate, a drain electrically coupled to a second supply voltage, OVDD, and a source electrically coupled to the anode of the OLED, a second transistor having a gate electrically coupled to a scan signal, Vscan(N), a drain electrode electrically coupled to the gate of the first transistor, and a source electrode electrically coupled to a data signal, Vdata, and a storage capacitor electrically connected between the gate and the drain of the first transistor.

In one embodiment, the OLED comprises a top-emitting OLED or a bottom-emitting OLED. Each of the first transistor, the second transistor and the read-out transistor comprises an NMOS transistor or PMOS transistor.

In one embodiment, the first supply voltage OVSS and the second supply voltage OVDD are a negative supply voltage and a positive supply voltage, respectively.

Each pixel also includes a read-out transistor having a gate electrically a sensing control voltage, Vsense, a drain for outputting a sensing signal, Isense, and a source, and a photo sensor electrically coupled between the anode of the OLED and the source of the read-out transistor. The photo sensor is adapted for measuring brightness of an ambient light that is proportional to light emitted from the OLED and generating the sensing signal Isense corresponding to the measured brightness of the ambient light, wherein the sensing signal Isense is utilized to adjust the data signal Vdata.

In yet another aspect, the present invention relates to a display. In one embodiment, the display has a substrate, and a plurality of pixels formed on the substrate and arranged in an array. Each pixel includes a driving transistor having a gate electrode, a drain electrode and a source electrode, formed on the substrate, an OLED having a cathode layer, a anode layer and an emissive layer formed between the cathode layer and the anode layer, and formed over the driving transistor such that the anode layer of the OLED is electrically connected to the source electrode of the driving transistor, a bias electrode formed over the substrate, and a photo sensor having a photosensitive layer formed between the anode layer of the OLED and the bias electrode.

The anode layer of the OLED is formed such that at least a portion that overlaps the photosensitive layer of the photo sensor is partially transparent to light emitted from the emissive layer of the OLED. The photo sensor is adapted for measuring brightness of an ambient light that is proportional to light emitted from the OLED and generating a sensing signal corresponding to the measured brightness of the ambient light, wherein the sensing signal is output from the bias electrode and utilized to adjust a driving voltage of the OLED accordingly.

In one embodiment, the OLED comprises a top-emitting OLED or a bottom-emitting OLED.

In one embodiment, the photosensitive layer defines a photo sensing area. The photo sensing area for the top-emitting OLED is larger than that for bottom-emitting OLED. The photosensitive layer is formed of a Si-rich dielectric material.

In one embodiment, the driving transistor includes an NMOS transistor or PMOS transistor. The driving transistor includes a BCE type TFT, an IS type TFT, a coplanar type TFT, a bottom-gate type TFT, or a top-gate type TFT.

In a further aspect, the present invention relates to a display. In one embodiment, the display has an AMOLED panel having a plurality of pixel arranged in an array. Each pixel has an organic light emitting diode (OLED) having a cathode electrically coupled to a first supply voltage, OVSS, an anode and an emissive layer formed between the cathode and the anode, and a driving circuit having a first transistor having a gate, a drain electrically coupled to a second supply voltage, OVDD, and a source electrically coupled to the anode of the OLED, a second transistor having a gate electrically coupled to a scan signal, Vscan(N), a drain electrode electrically coupled to the gate of the first transistor, and a source electrode electrically coupled to a data signal, Vdata, and a storage capacitor electrically connected between the gate and the drain of the first transistor.

In one embodiment, the OLED comprises a top-emitting OLED or a bottom-emitting OLED. The first supply voltage OVSS and the second supply voltage OVDD are a negative supply voltage and a positive supply voltage, respectively. Each of the first transistor and the second transistor comprises an NMOS transistor or PMOS transistor.

Each pixel further has a bias line for outputting a sensing signal, Vbias, and a photo sensor electrically coupled between the anode of the OLED and the bias line.

The photo sensor is adapted for measuring brightness of an ambient light that is proportional to light emitted from the OLED and generating the sensing signal Vbias corresponding to the measured brightness of the ambient light, wherein the sensing signal Vbias is output from the bias electrode and utilized to adjust the data signal Vdata.

In yet a further aspect, the present invention relates to a display. In one embodiment, the display has an AMOLED panel having a plurality of pixels arranged in an array. Each pixel comprises an OLED having a cathode electrically coupled to a first supply voltage, OVSS, and an anode electrically coupled to a second voltage, OVDD, and a photo sensor for measuring brightness of an ambient light that is proportional to light emitted from the OLED and generating a sensing signal corresponding to the measured brightness of the ambient light, wherein the sensing signal is utilized to adjust a driving voltage of the OLED accordingly.

In one embodiment, each pixel further comprises a first transistor having a gate, a drain electrically coupled to the second supply voltage, OVDD, and a source electrically coupled to the anode of the OLED, a second transistor having a gate electrically coupled to a scan signal, Vscan(N), a drain electrode electrically coupled to the gate of the first transistor, and a source electrode electrically coupled to a data signal, Vdata, and a storage capacitor electrically connected between the gate and the drain of the first transistor.

In one embodiment, each of the first transistor and the second transistor comprises an NMOS transistor or PMOS transistor. In one embodiment, the data signal Vdata is adjustable so as to adjust the driving voltage of the OLED according to the sensing signal.

In one aspect, the present invention relates to a method of driving a display having an active matrix organic light emitting diode (AMOLED) panel having a plurality of pixels arranged in an array, each pixel comprising an organic light emitting diode (OLED). In one embodiment, the method includes the steps of measuring brightness of an ambient light that is proportional to light emitted from the OLED so as to generate a sensing signal corresponding to the measured brightness of the ambient light, and adjusting a driving voltage of the OLED according to the sensing signal.

In one embodiment, the measuring step is performed with a photo sensor coupled to the OLED.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
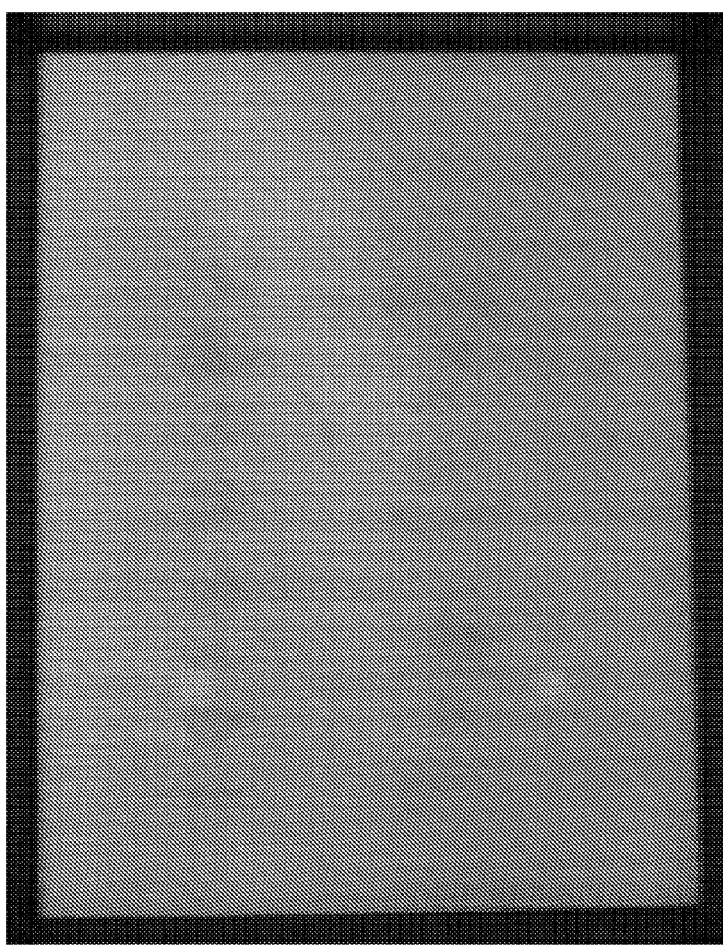
FIG. 1 shows a conventional AMOLED display panel with the line mura defect problem.

The present disclosure is more particularly described in the following examples that are intended as illustrative only since numerous modifications and variations therein will be apparent to those skilled in the art. Various embodiments of the disclosure are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. The use of examples anywhere in this specification, including examples of any terms discussed herein, is illustrative only, and in no way limits the scope and meaning of the disclosure or of any exemplified term. Likewise, the disclosure is not limited to various embodiments given in this specification.

As used herein, the terms "comprising," "including," "having," "containing," "involving," and the like are to be understood to be open-ended, i.e., to mean including but not limited to.

The present invention can be employed in most OLED display configurations. These include very simple structures comprising single anode and cathode to more complex displays, such as passive matrix displays including orthogoanl arrays of anodes and cathodes to form light emitting elements, and active matrix displays where each light emitting element is controlled independently, for example, within thin film transistors. In accordance with the purposes of this invention, as embodied and broadly described herein, this invention, in one aspect, relates to an improved layout of AMOLED pixel structure which incorporates a photo sensitive layer to serve as a photo sensor for optical feedback compensation.

Figure 2:
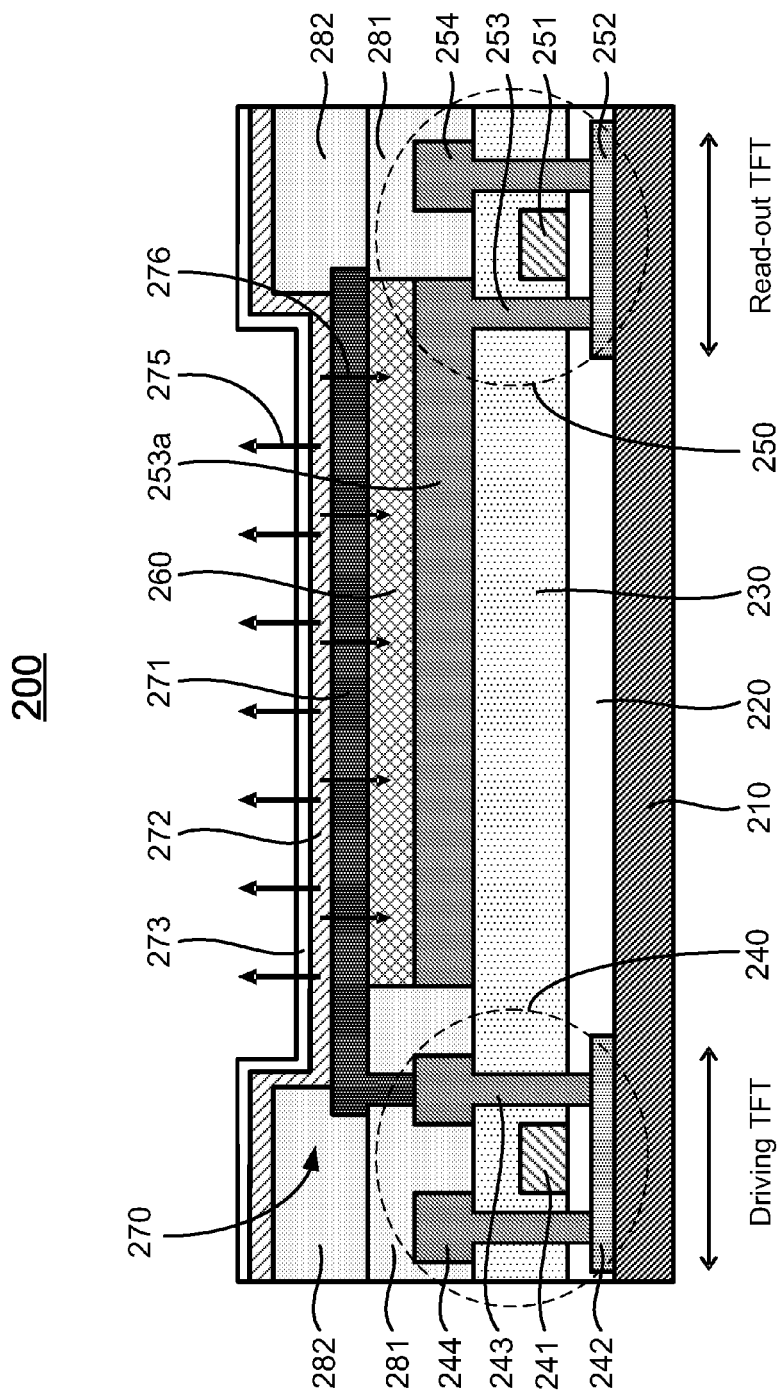
FIG. 2 shows a schematic cross-sectional view illustrating a top emission AMOLED pixel structure according to one embodiment of the invention.

FIG. 2 illustrates a cross-sectional view of a pixel structure 200 of an AMOLED display according to one embodiment of the invention. In this exemplary embodiment, the pixel 100 of the AMOLED display includes at least structures as set forth below. A supporting substrate 210 has a first end portion corresponding to a driving TFT 240 and an opposite, second end portion corresponding to a read-out TFT 250. A semiconductor layer having a first portion 242 and a second portion 252 is correspondingly disposed on the first and second end portions of the substrate 210. A gate insulator layer 220 is formed on the substrate 210 and covers the semiconductor layer. A gate metal layer having a first portion 241 and a second portion 252 is correspondingly disposed on the two end portions of the gate insulator layer 220 via an interlayer dielectric (ILD) 230. A first source metal layer 243 and a first drain metal layer 244 are electrically connected to the first portion 242 of the semiconductor layer and correspondingly disposed on the first end portion of the interlayer dielectric 230. A second source metal layer 253 and a second drain metal layer 254 are electrically connected to the second portion 252 of the semiconductor layer and correspondingly disposed on the second end portion of the interlayer dielectric 230. The first portion 241 of the gate metal layer, the first portion 242 of the semiconductor layer, the first source metal layer 243 and a first drain metal layer 244 constitute the driving TFT 240. The second portion 251 of the gate metal layer, the second portion 252 of the semiconductor layer, the second source metal layer 253 and a second drain metal layer 254 constitute the driving TFT 250.

A photo sensor includes a photosensitive (Si-rich dielectric) layer 260 disposed on an extending portion 253a of the second source metal layer 253 extending to an emission region or light emitting area (LEA) of the pixel 200 of the display. The photosensitive layer 260 defines a photo sensing area (PSA) that is located in the LEA and is not larger that the LEA. A first passivation layer 281 correspondingly disposed on the first and second end portions of the interlayer dielectric 230, so as to define a space therebetween in which the extending portion 253a of the second source metal layer 253 and the photosensitive layer 260 are disposed. A second passivation layer 282 correspondingly disposed on the first passivation layer 281.

An OLED 270 has an anode layer 271 disposed on the photosensitive layer 260 and electrically connected to the first source metal layer 243 over the emission region (i.e., LEA) of the pixel 200 of the display, an OLED emissive layer 272 disposed on and covered both the second passivation layer 282 and the anode layer 272, and a cathode layer 273 disposed on and covered the OLED emissive layer 272. As shown in FIG. 2, the OLED emissive layer 272 and the cathode layer 273 of the OLED 270 are extended to cover both the driving transistor 240 and the read-out transistor 250, and the anode layer 271 of the OLED 270 is formed in direct contact with the photosensitive layer 260. The anode layer 271 of the OLED 270 is formed such that at least a portion that overlaps the photosensitive layer 260 of the photo sensor is partially transparent to light emitted from the emissive layer 272 of the OLED 270. The other portion of the anode layer 271 of the OLED 270 may or may not be transparent to light emitted from the emissive layer 272 of the OLED 270.

In this embodiment, the OLED 270 is a top emission OLED, i.e., the majority portion 275 of light emitted from the OLED emissive layer 272 transmits out from the cathode layer 273. The remaining portion 276 of the light emitted from the OLED emissive layer 272 transmits out from the anode layer 273 and to the photosensitive layer 260. Accordingly, the photo sensor measures the brightness of the remaining portion 276 of the light, i.e., an ambient light to the photo sensor, which is proportional to the light emitted from the OLED emissive layer 272, and generating a sensing signal corresponding to the measured brightness of the ambient light. The read-out TFT 250 reads and outputs the sensing signal. The sensing signal in turn, is utilized to adjust a driving voltage of the OLED 270 through the driving TFT 240 accordingly.

Figure 3:
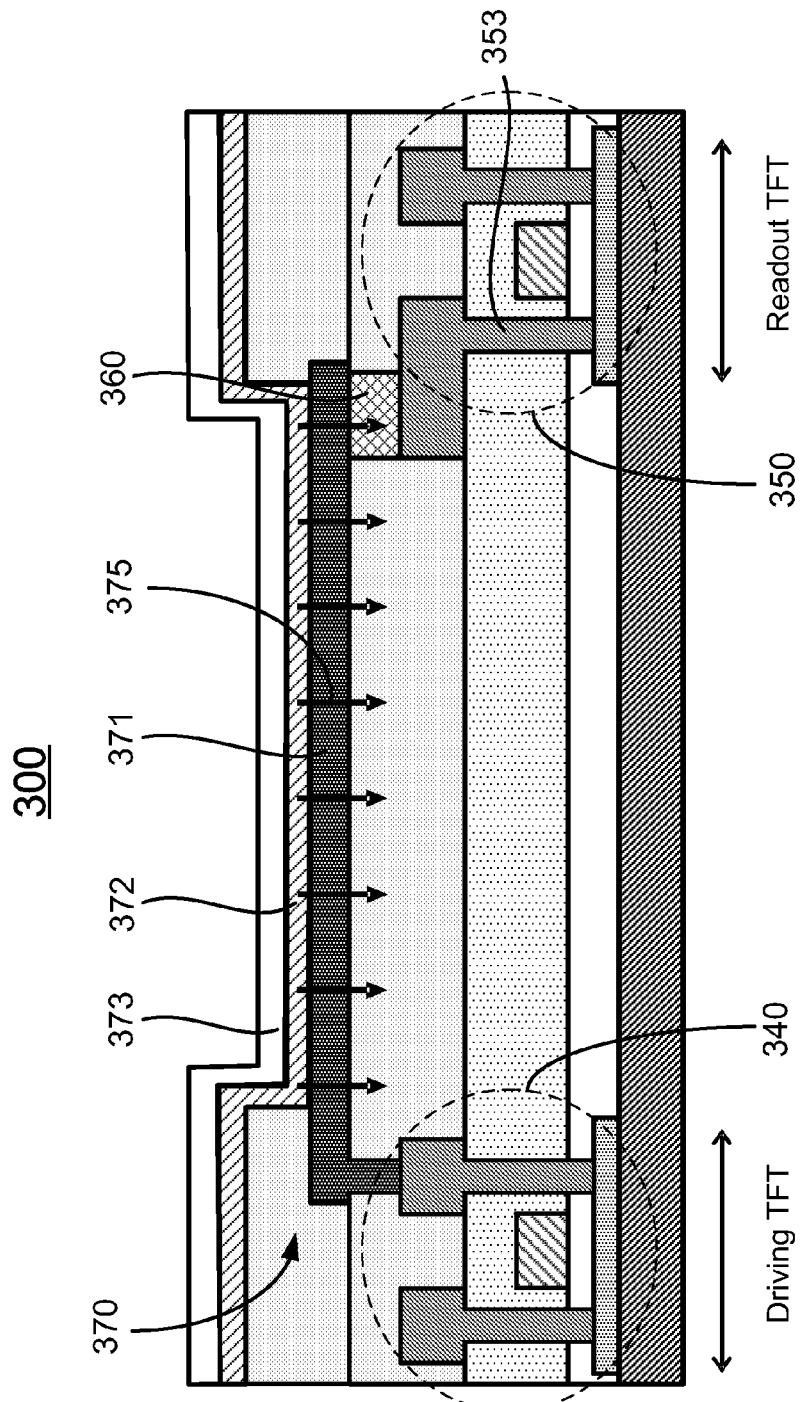
FIG. 3 shows a schematic cross-sectional view illustrating a bottom emission AMOLED pixel structure according to another embodiment of the invention.

FIG. 3 shows a pixel structure 300 of an AMOLED display according to another embodiment of the invention. The pixel structure 300 are similar to the pixel structure 200 disclosed above and shown in FIG. 2, except that the OLED 370 is a bottom emission OLED, i.e., the light 375 emitted from the OLED emissive layer 372 transmits out from the anode layer 372. The anode layer 372 is formed to be transparent to light emitted from the emissive layer 372 of the OLED 370. Accordingly, the photosensitive layer 360 defines a photo sensing area (PSA) that is much less than that corresponding to the top emission OLED shown in FIG. 2. In addition, the PSA is located in the LEA of OLED 370 and less than the LEA of OLED 370. The photosensitive layer 360 is formed between the anode layer 371 of the OLED 370 and the second source layer 353 of the read-out TFT 350, as such the majority portion of the space defined between the diving TFT 340 and the read-out TFT 350 is corresponding to an emission region (i.e., LEA) of the OLED 370. Particularly, as shown in FIG. 3, the OLED emissive layer 372 and the cathode layer 373 of the OLED 370 are extended to cover both the driving transistor 340 and the read-out transistor 350, and the anode layer 371 of the OLED 370 is formed in direct contact with the photosensitive layer 360. In operation, the majority portion of the light 375 emitted from the OLED emissive layer 372 transmits out from the emission region, while the remaining portion of the light 375 transmits out from the anode layer 373 and to the photosensitive layer 360. Accordingly, the photo sensor measures the brightness of the remaining portion of the light 375, i.e., an ambient light to the photo sensor, which is proportional to the light 375 emitted from the OLED emissive layer 372, and generating a sensing signal corresponding to the measured brightness of the ambient light. The read-out TFT 350 reads and outputs the sensing signal. The sensing signal in turn, is utilized to adjust a driving voltage of the OLED 370 through the driving TFT 340 accordingly.

Figure 4:
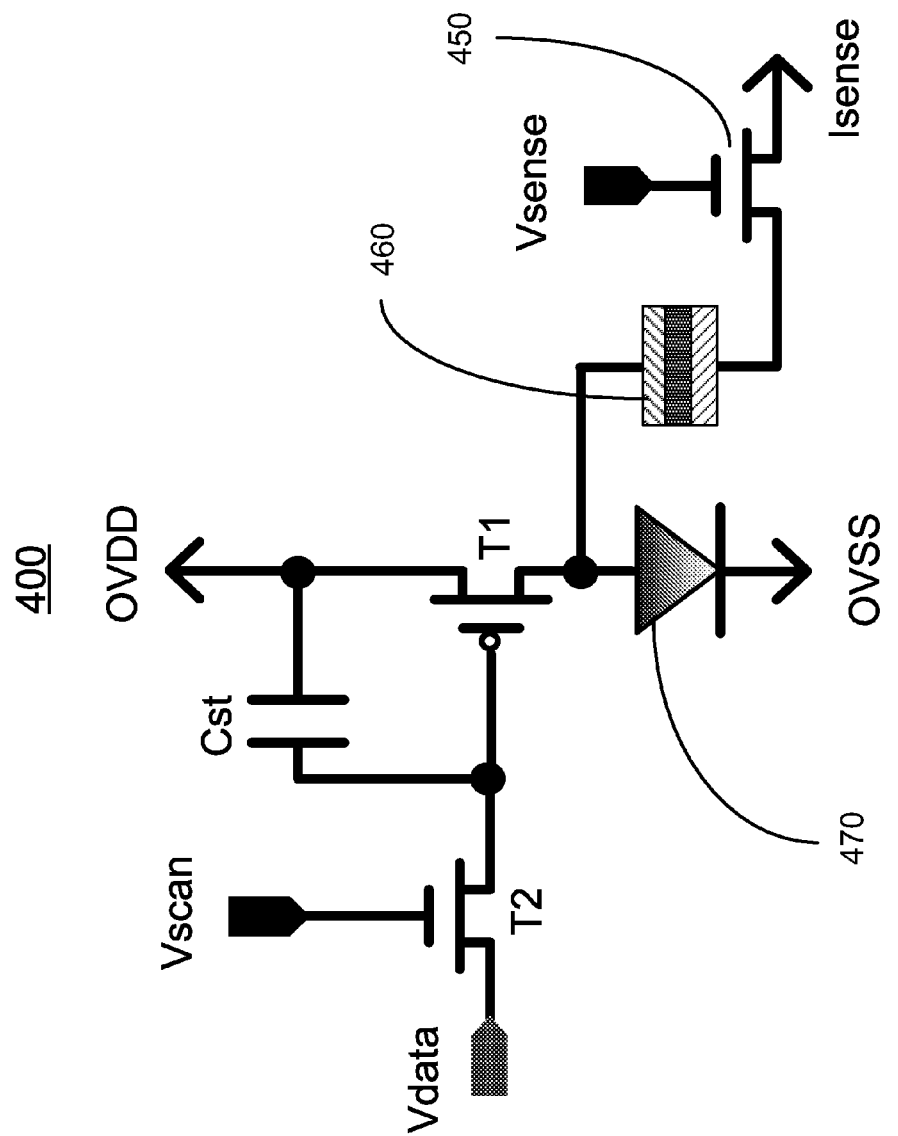
FIG. 4 shows a schematic circuit diagram of a pixel structure of the AMOLED display according to one embodiment of the invention.

FIG. 4 shows a circuit diagram of a pixel 400 of an AMOLED display according to yet another embodiment of the invention. The AMOLED display has an AMOLED panel having a plurality of pixels 400 arranged in an array. Each pixel 400 includes an OLED 470 having a cathode electrically coupled to a first supply voltage, OVSS, an anode and an emissive layer formed between the cathode and the anode. The OLED 470 can be a top-emitting OLED or a bottom-emitting OLED. Each pixel 400 also includes a first transistor T1 having a gate, a drain electrically coupled to a second supply voltage, OVDD, and a source electrically coupled to the anode of the OLED 470, a second transistor T2 having a gate electrically coupled to a scan signal, Vscan(N), a drain electrode electrically coupled to the gate of the first transistor T1, and a source electrode electrically coupled to a data signal, Vdata, and a storage capacitor Cst electrically connected between the gate and the drain of the first transistor T1. The first supply voltage OVSS and the second supply voltage OVDD are a negative supply voltage and a positive supply voltage, respectively.

Further, each pixel 400 includes a read-out TFT 450 having a gate electrically coupled to a sensing control voltage, Vsense, a drain for outputting a sensing signal, Isense, and a source, and a photo sensor 460 electrically coupled between the anode of the OLED 470 and the source of the read-out transistor 450. The photo sensor 460 is adapted for optical feedback compensation, specifically, for measuring brightness of an ambient light that is proportional to light emitted from the OLED 470 and generating the sensing signal Isense corresponding to the measured brightness of the ambient light. The sensing signal Isense in turn, is utilized to adjust the data signal Vdata.

Each of the first transistor T1, the second transistor T2 and the read-out transistor 450 comprises an NMOS transistor or PMOS transistor.

Figure 5:
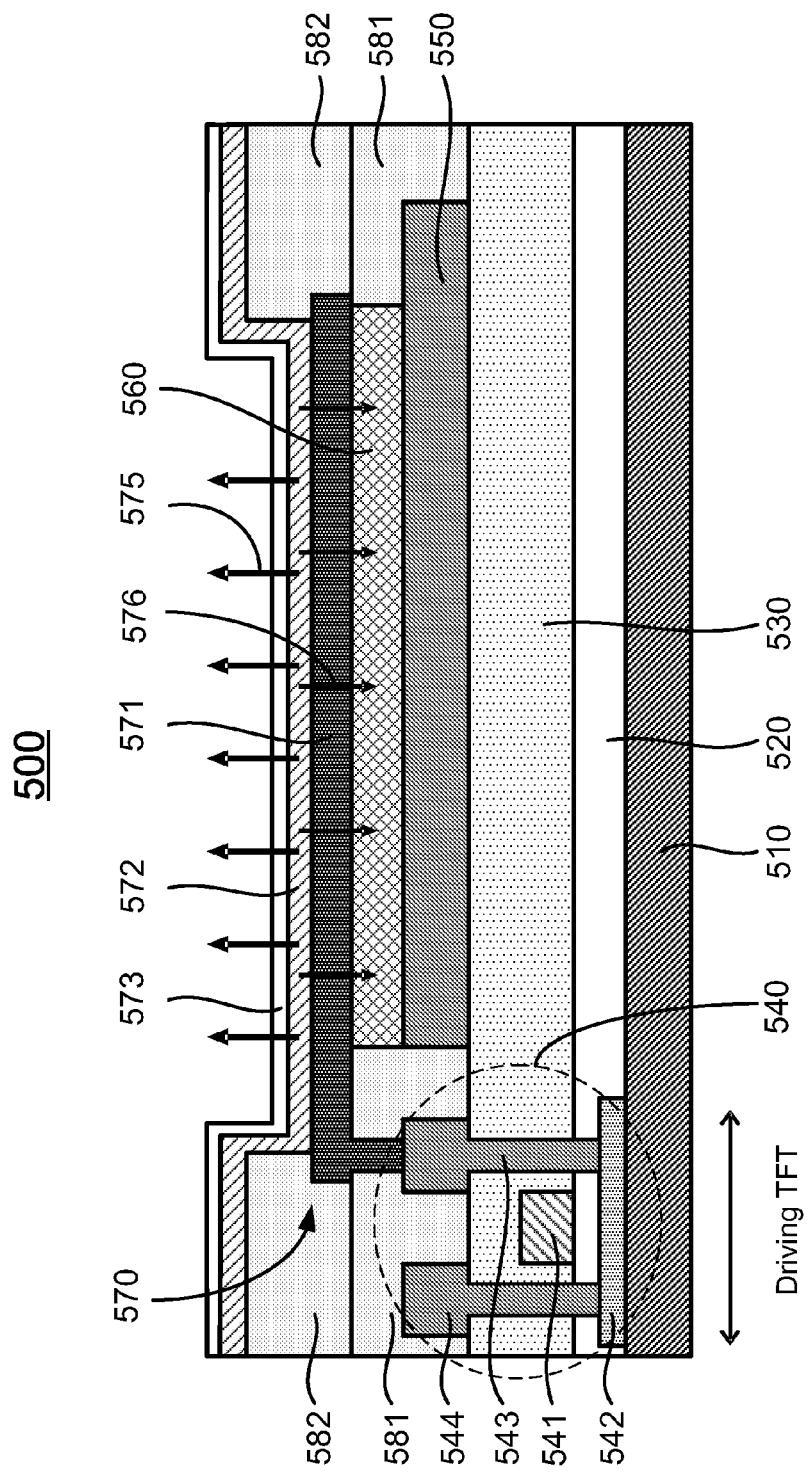
FIG. 5 shows a schematic cross-sectional view illustrating a top emission AMOLED pixel structure according to one embodiment of the invention.

FIG. 5 shows a pixel structure 500 of an AMOLED display according to one embodiment of the present invention. The display has a substrate 510, and a plurality of pixels 500 formed on the substrate 510 and arranged in an array. The pixel 500 includes a driving transistor 540 having a gate layer 541, a drain layer 544 and a source layer 543, formed on the substrate 510. The pixel 500 also includes an OLED 570 having a cathode layer 573, a anode layer 571 and an emissive layer 572 formed between the cathode layer 573 and the anode layer 571, and formed over the driving transistor 540 such that the anode layer 571 of the OLED 570 is electrically connected to the source layer 544 of the driving transistor 540. Further, the pixel 500 includes a bias layer 550 formed over the substrate 510, and a photo sensor having a photosensitive layer 560 formed between the anode layer 571 of the OLED 570 and the bias layer 550.

More specifically, the driving TFT 540 is formed on one end portion of the supporting substrate 510. A semiconductor layer 542 is disposed on the one end portion of the substrate 510. A gate insulator layer 420 is disposed on the substrate 412 and covers the semiconductor layer 542. The gate metal layer 541 is disposed on the gate insulator layer 520 at a location that is over the semiconductor layer 542. An interlayer dielectric (ILD) layer 530 is disposed on the gate insulator layer 520 and covers the gate metal layer 541. The drain layer 544 and the source layer 543 of the driving TFT 540 are spatially formed one the interlayer dielectric layer 530 and are connected to the semiconductor layer 542. Further, a metal bias electrode layer 550 is disposed on the interlayer dielectric layer 530 over the other end portion of the substrate 510 and extends into the emission region of the pixel 500.

A photosensitive layer 560 is disposed on the metal bias electrode layer 550 at an emission region of the pixel 500. The anode layer 571 of the OLED 570 is disposed on the photosensitive layer 560 having one end portion electrically connected to the source layer 543 of the driving TFT 540, and the other end portion extended over the other end portion of the substrate 510. A first passivation layer 581 is correspondingly disposed on the two ends of the interlayer dielectric 420 so that the emission region of the pixel 500 is defined therebetween. A second passivation layer 582 is correspondingly disposed on the first passivation layer 581. The OLED emissive layer 572 of the OLED 570 is disposed on the anode layer 571 and covers both the second passivation layer 582 and the anode layer 571. The cathode layer 434 of the OLED 570 is disposed on and covers the OLED emissive layer 572 of the OLED 570.

In the exemplary embodiment shown in FIG. 5, the OLED 570 is a top emission OLED, i.e., the majority portion 575 of light emitted from the OLED emissive layer 572 transmits out from the cathode layer 573. The remaining portion 576 of the light emitted from the OLED emissive layer 572 transmits out from the anode layer 573 and to the photosensitive layer 560. Accordingly, the photo sensor measures the brightness of the remaining portion 576 of the light, an ambient light to the photo sensor, which is proportional to the light emitted from the OLED emissive layer 572, and generating a sensing signal corresponding to the measured brightness of the ambient light. The read-out TFT 550 reads and outputs the sensing signal. The sensing signal is output from the bias electrode 560 and utilized to adjust a driving voltage of the OLED 570 through the driving TFT 540 accordingly.

Figure 6:
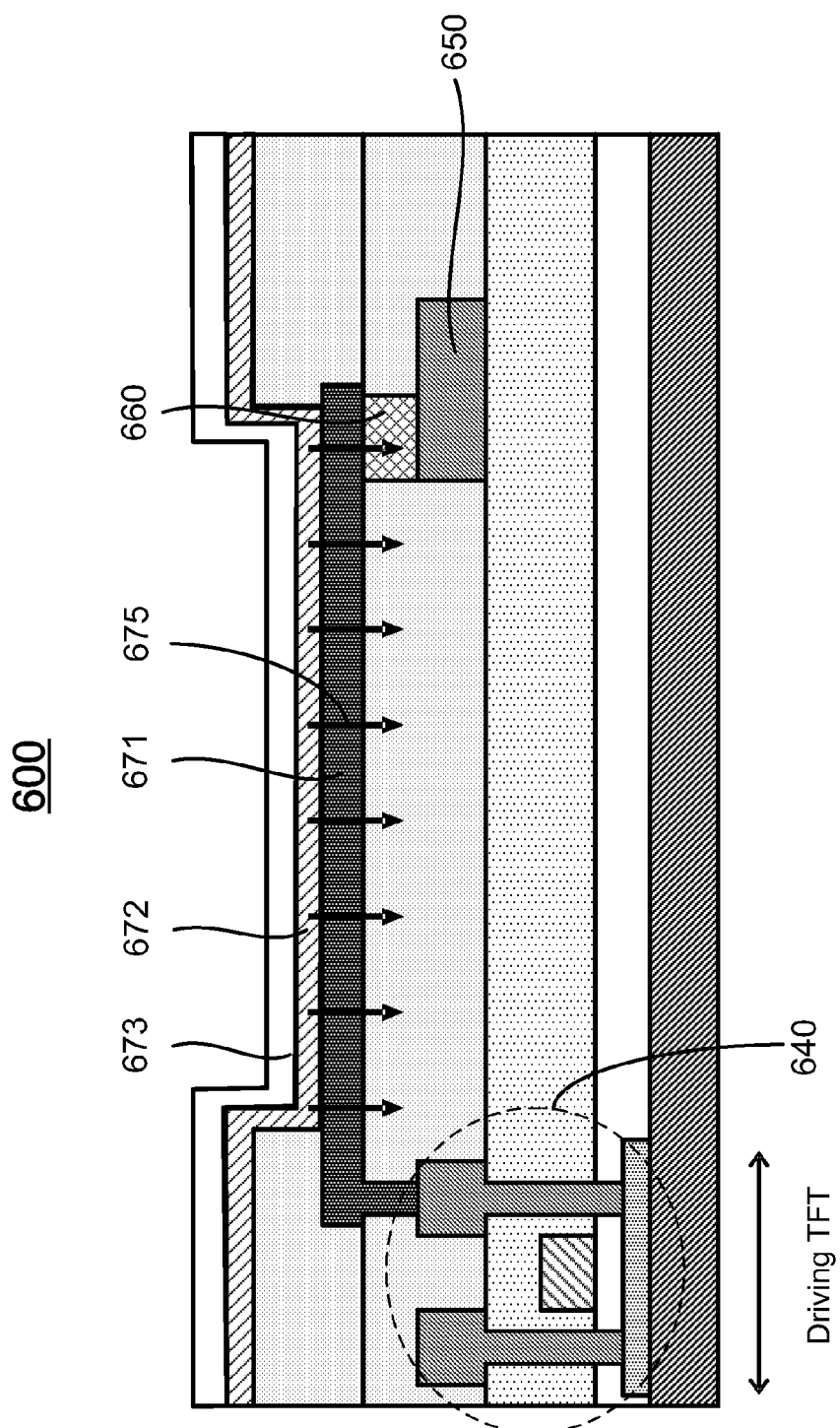
FIG. 6 shows a schematic cross-sectional view illustrating a bottom emission AMOLED pixel structure according to another embodiment of the invention.

FIG. 6 shows a pixel structure 600 of an AMOLED display according to another embodiment of the invention. The pixel structure 600 are similar to the pixel structure 500 disclosed above and shown in FIG. 5, except that the OLED 670 is a bottom emission OLED, i.e., the light 675 emitted from the OLED emissive layer 672 transmits out from the anode layer 672. Accordingly, the photosensitive layer 660 defines a photo sensing area that is much less than that corresponding to the top emission OLED shown in FIG. 5. The photosensitive layer 660 is formed between the anode layer 671 of the OLED 670 and the bias electrode 650, as such the majority portion of the space defined between the diving TFT 640 and the bias electrode 650 is corresponding to an emission region of the OLED 670. In operation, the majority portion of the light 275 emitted from the OLED emissive layer 272 transmits out from the emission region, while the remaining portion of the light 675 transmits out from the anode layer 673 and to the photosensitive layer 660. Accordingly, the photo sensor measures the brightness of the remaining portion of the light 675, i.e., an ambient light to the photo sensor, which is proportional to the light 675 emitted from the OLED emissive layer 672, and generating a sensing signal corresponding to the measured brightness of the ambient light. The bias electrode 650 outputs the sensing signal. The sensing signal in turn, is utilized to adjust a driving voltage of the OLED 670 through the driving TFT 640 accordingly.

Figure 7:
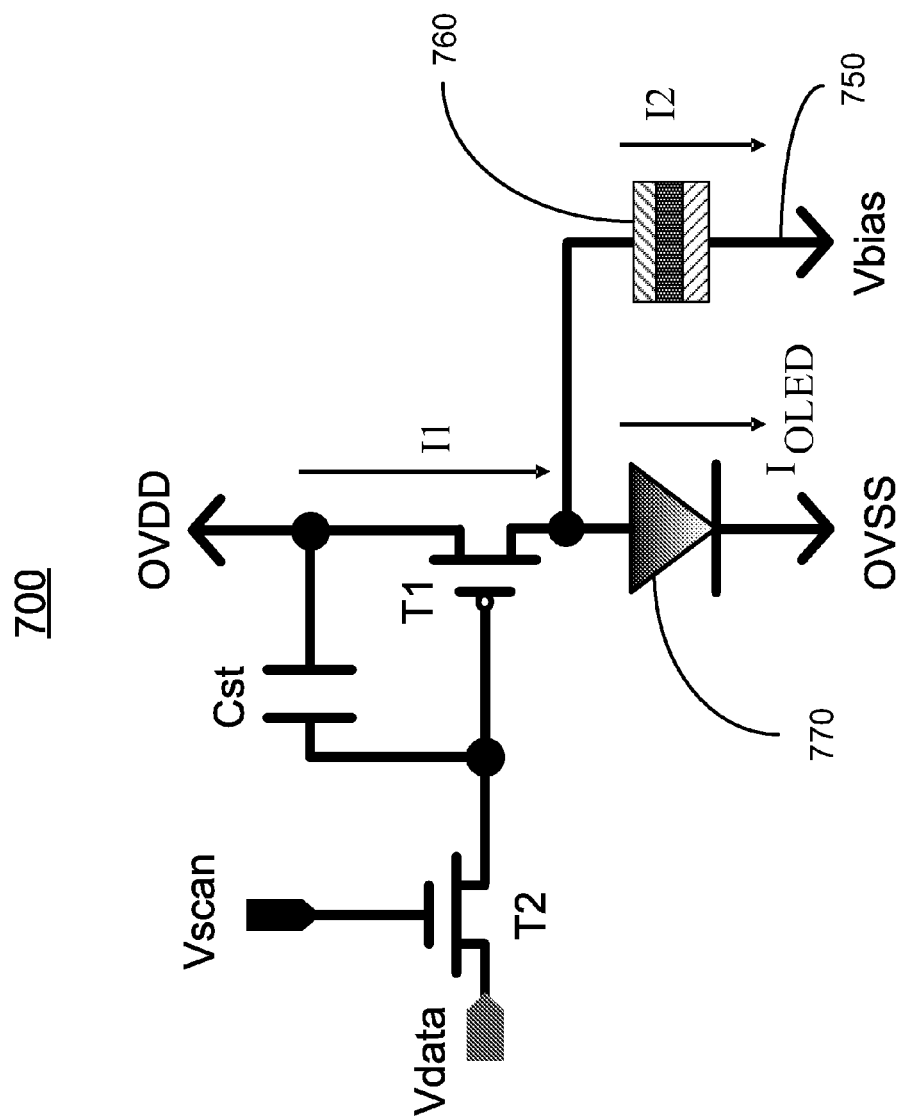
FIG. 7 shows a schematic circuit diagram of a pixel structure of the AMOLED display according to one embodiment of the invention.

FIG. 7 shows a circuit diagram of a pixel 700 of an AMOLED display according to yet another embodiment of the invention. The AMOLED display has an AMOLED panel having a plurality of pixels 700 arranged in an array. Each pixel 700 includes an OLED 770 having a cathode electrically coupled to a first supply voltage, OVSS, an anode and an emissive layer formed between the cathode and the anode. The OLED 770 can be a top-emitting OLED or a bottom-emitting OLED. Each pixel 700 also includes a first transistor T1 having a gate, a drain electrically coupled to a second supply voltage, OVDD, and a source electrically coupled to the anode of the OLED 770, a second transistor T2 having a gate electrically coupled to a scan signal, Vscan(N), a drain electrode electrically coupled to the gate of the first transistor T1, and a source electrode electrically coupled to a data signal, Vdata, and a storage capacitor Cst electrically connected between the gate and the drain of the first transistor T1. The first supply voltage OVSS and the second supply voltage OVDD are a negative supply voltage and a positive supply voltage, respectively. Each of the first transistor T1 and the second transistor T2 comprises an NMOS transistor or PMOS transistor.

Further, each pixel 700 includes a photo sensor 760 electrically coupled to the anode of the OLED 770 for measuring brightness of an ambient light that is proportional to light emitted from the OLED 770 and generating the sensing signal $I_2$ corresponding to the measured brightness of the ambient light, and a bias electrode (line) 750 electrically coupled to the photo sensor 760 for outputting the sensing signal $I_2$. The generated current of the OLED 770, $I_{OLED}=(I_1-I_2)$, where $I_1$ is the current flow from the drain to the source of the first TFT T1, and $I_2$ is the sensing current of the photo sensor 760 that is output from the bias line 750. According to the invention, the sensing current $I_2$ is adapted for optical feedback compensation. For example, for a pixel driven under the same value of Vdata, if a small value of Vth_T1 results in a large $I_1$, the light emitted from the OLED 770 will be brighter. Accordingly, the photo sensor current I2 increases, which in turn, results in a decrease of the OLED current $I_{OLED}$, so that the light of the OLED 770 become darker. On the other hand, if a large value of Vth_T1 results in a small $I_1$, the light emitted from the OLED 770 will be darker. Accordingly, the photo sensor current I2 decreases, which in turn, results in an increase of the OLED current $I_{OLED}$, so that the light of the OLED 770 become brighter. As a result, the AMOLED display panel will not generate line mura during operation, largely improving the display quality of the AMOLED display panel.

The above disclosed driving TFT and the read-out TFT, as shown in FIGS. 2, 3, 5 and 6, are corresponding to top-gate type TFTs. Other types of TFTs can also be used as the driving TFT and the read-out TFT to practice the invention. FIGS. 8A-8D disclose a pixel structure of an AMOLED display according to four different embodiments 800A-800D of the invention. Each embodiment corresponds to a different type of the driving TFT and the read-out TFT. In these embodiments, each of the driving TFT and the read-out TFT is formed with a semiconductive layer 842/852, a gate layer 541/851, a source layer 843/853 and a drain layer 844/854. Different fabrication processes produce different type TFTs.

Figure 8A:
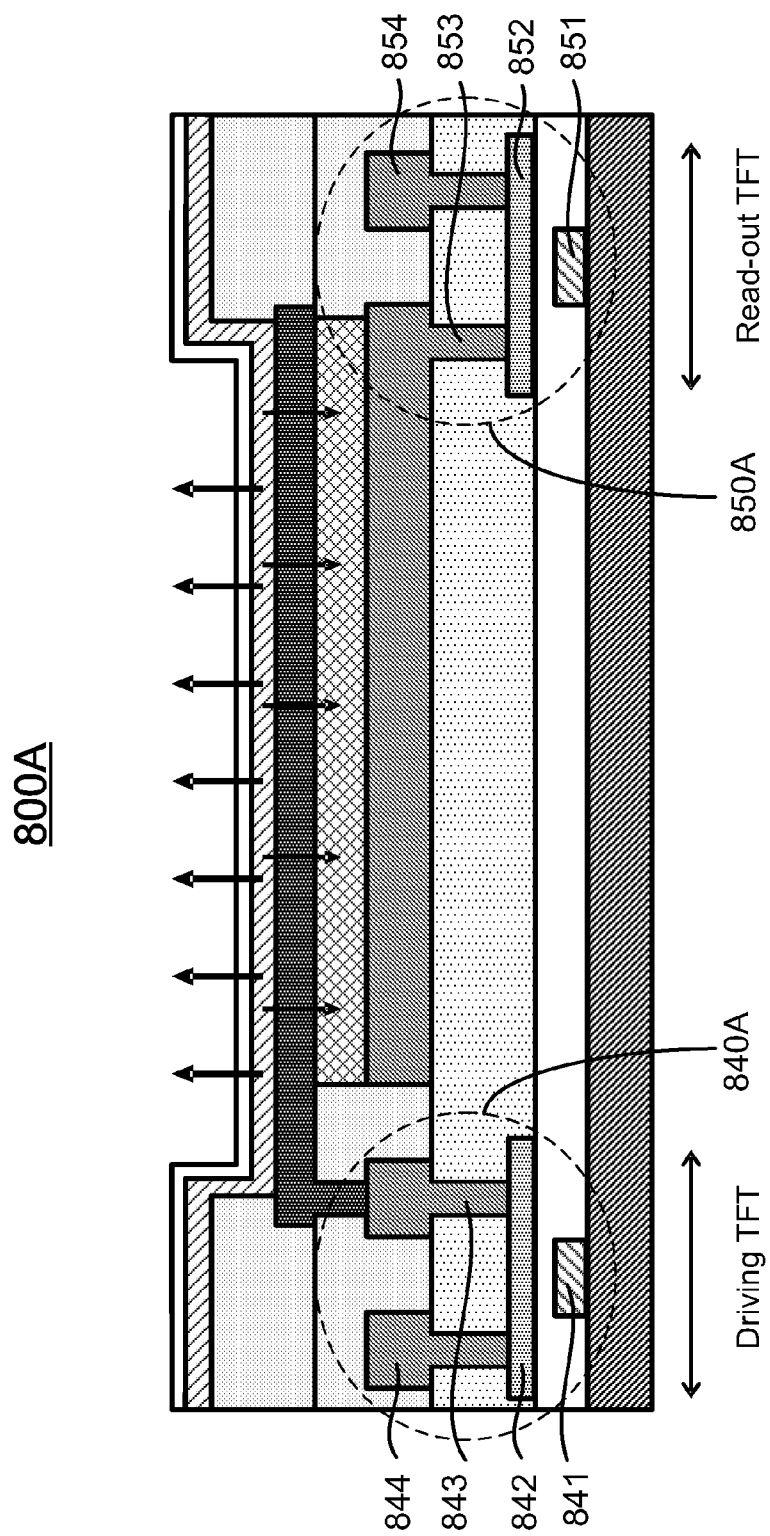
FIGS. 8A-8D show schematically cross-sectional views illustrating a top emission AMOLED pixel structure according to various embodiments of the invention.
Figure 8B:
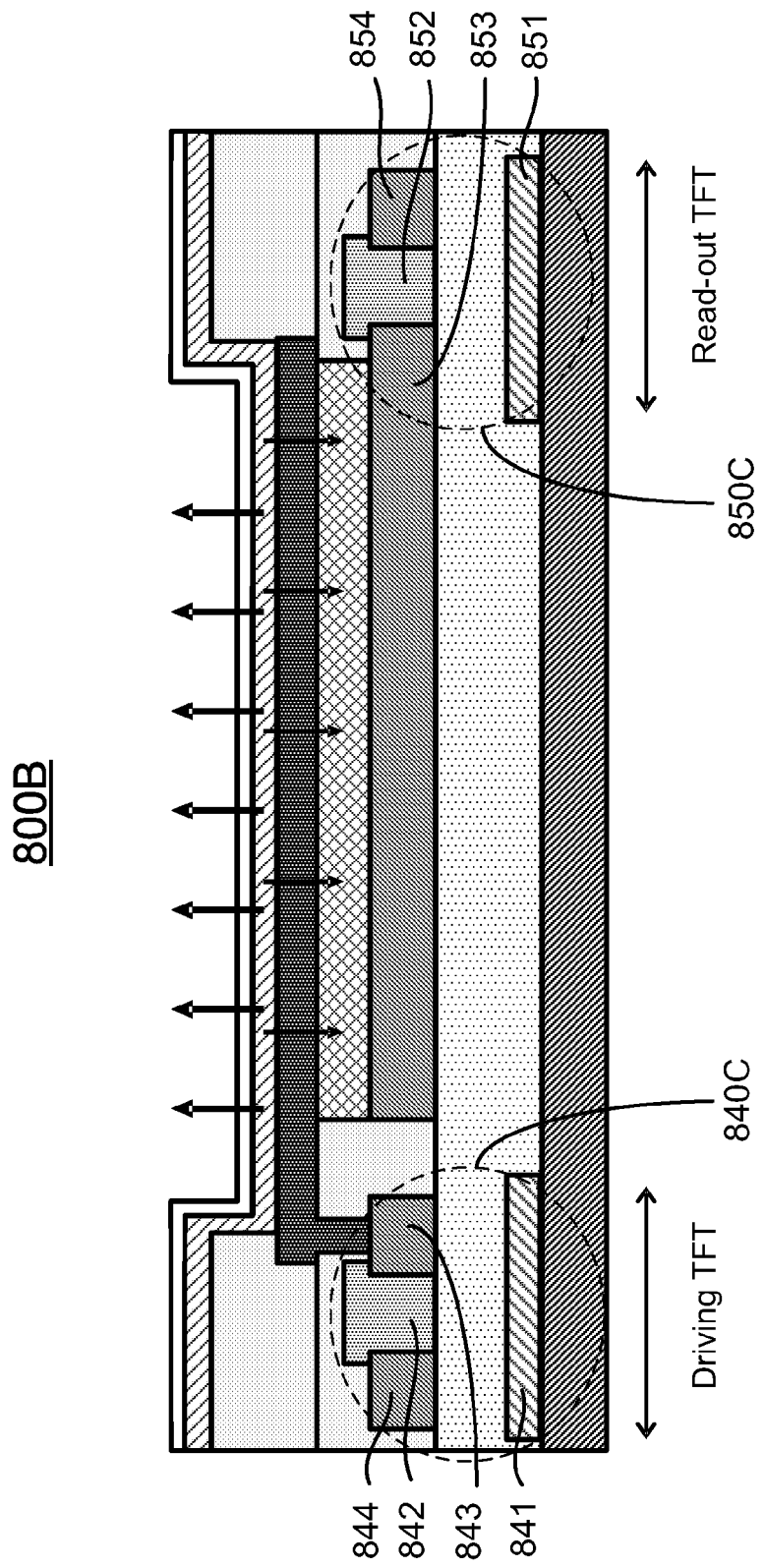
Figure 8C:
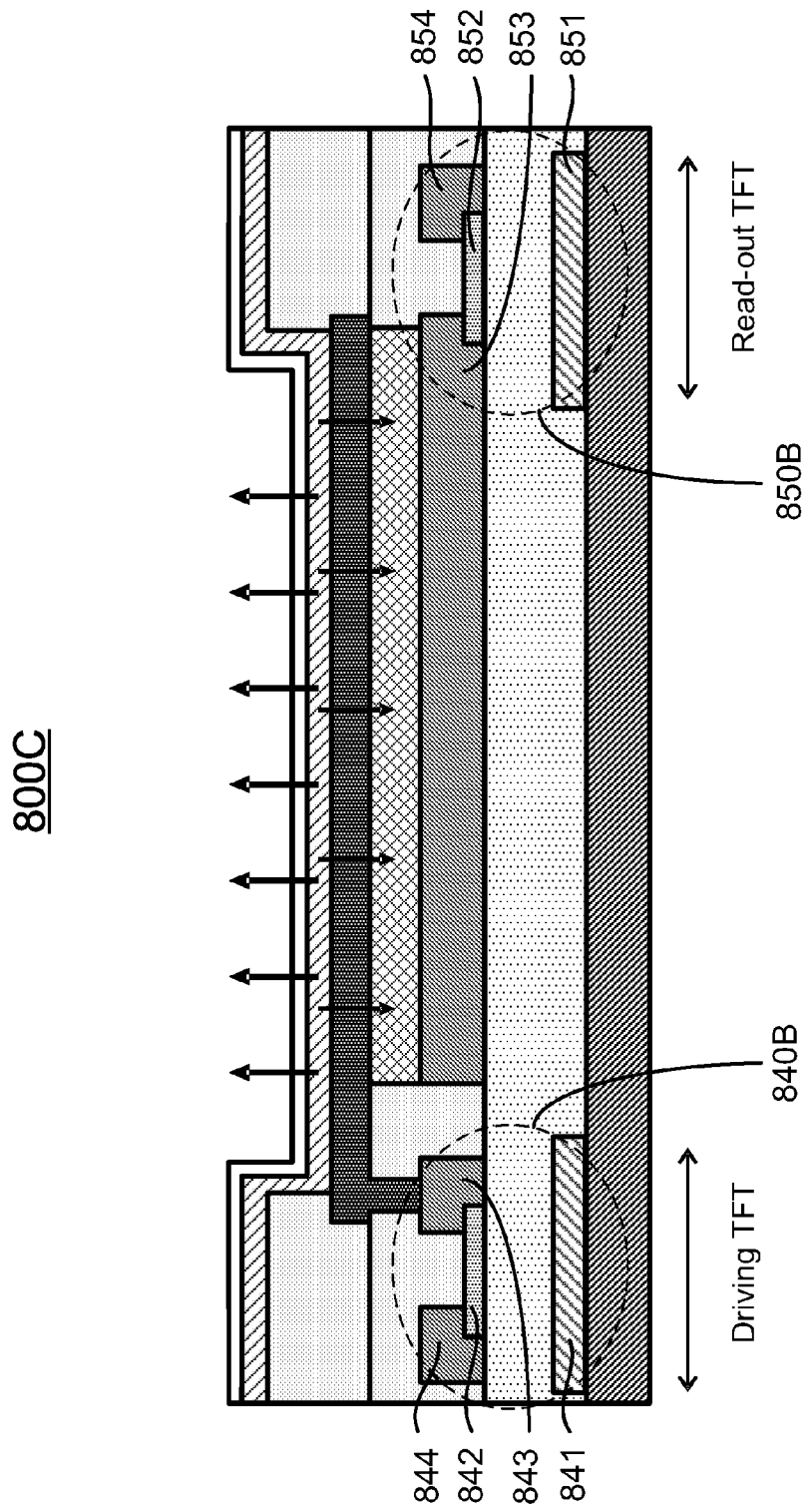
Figure 8D:
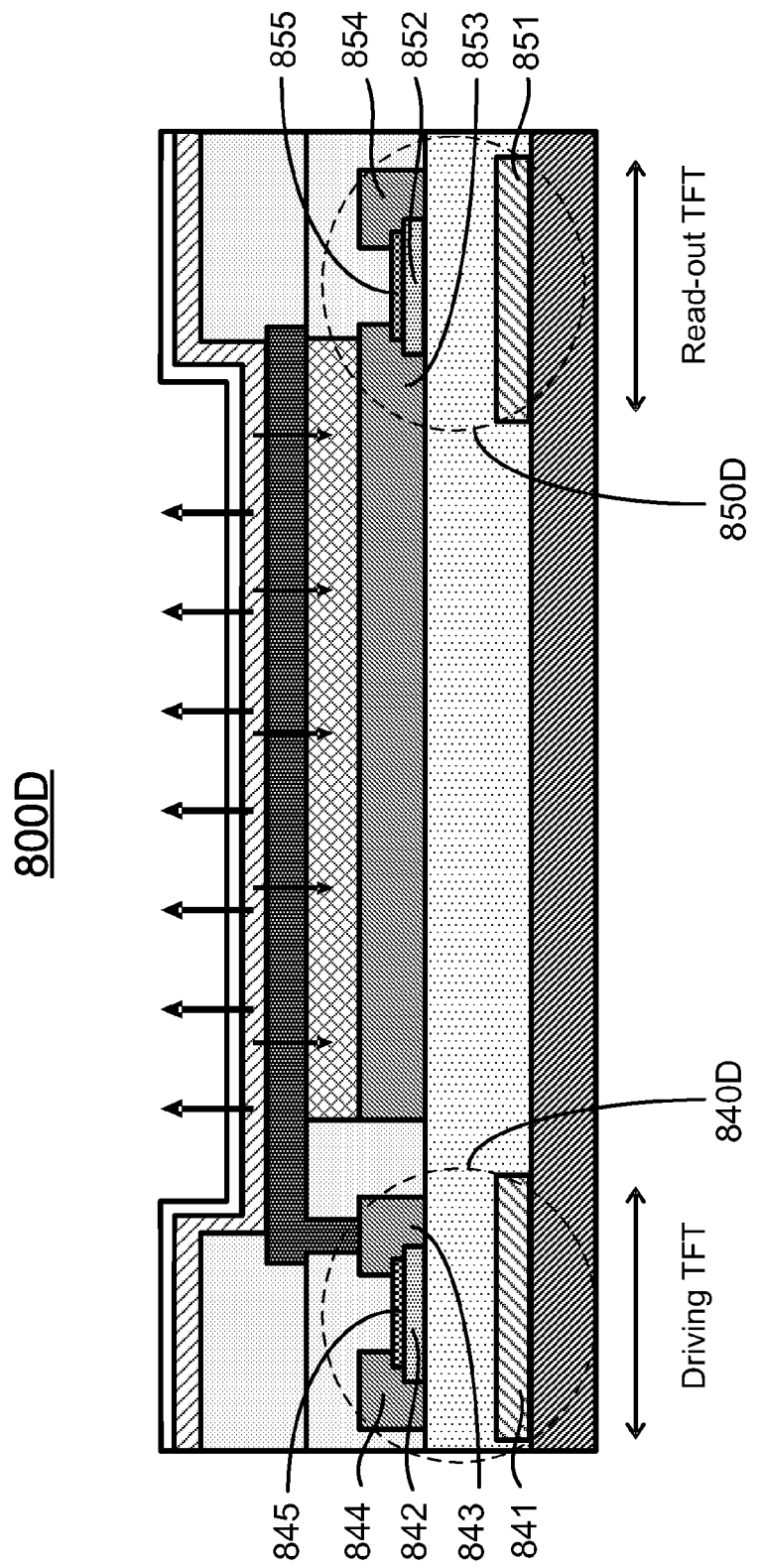

For example, as shown in FIG. 8A, the driving TFT 840A and the read-out TFT 850A are respectively formed in a bottom gate type TFT. FIG. 8B shows the driving TFT 840B and the read-out TFT 850B respectively formed in a coplanar type TFT. FIG. 8C shows the driving TFT 840C and the read-out TFT 850C respectively formed in a back channel etched (BCE) type TFT. And FIG. 8D shows the driving TFT 840C and the read-out TFT 850C respectively formed in an IS type TFT, where an etch stop layer 845/855 is disposed on the semiconductive layer 842/852.

As to the materials forming the pixel structure, the supporting substrate, which can include, but not limited to, glass, plastic, semiconductor materials, silicon, ceramics, and circuit board materials. The semiconductor layer can include, but not limited to, polysilicon, (coplanar/IS/BCE structure) metal oxide materials such as IZO, IGZO, AnO and $In_2O_3$. The gate insulator layer can include, but not limited to, SiOx, SiNx, SiOx/SiNx and AlOx. The gate metal layer can include, but not limited to, Mo, AlNd, Ti/AlTi, Mo/Al; Mo and Cu. The interlayer dielectric layer can include, but not limited to, SiOx, SiNx and SiOx/SiNx. The etch stop layer, as shown in FIG. 8D, can include, but not limited to, SiOx, SiNx and AlOx. The source/drain metal layer can include, but not limited to, Mo, AlNd, Ti/Al/Ti, Mo/Al/Mo and Cu. The metal bias line layer can include, but not limited to, Mo, AiNd, Ti/Al/Ti, Mo/Al/M and Cu. The photsenstive layer can include, but not limited to, Si-rch dielectric or other photosensitive materials. The anode layer can include, but not limited to, ITO, IZO, AI, Ag, AI/ITO, Ag/ITO, ITO/Ag/ITO and Mo/AI/ITO. The first passivation layer can include, but not limited to, SiOx, SiNx, SiOx/organic materials, SiNx/organic materials and organic materials. The second passivation layer can include, but not limited to, SiOX, SiNx and organice materials.

One aspect of the present invention relates to a method of driving a display having an active matrix organic light emitting diode (AMOLED) panel having a plurality of pixels arranged in an array, each pixel comprising an organic light emitting diode (OLED). In one embodiment, the method includes the steps of measuring brightness of an ambient light that is proportional to light emitted from the OLED so as to generate a sensing signal corresponding to the measured brightness of the ambient light, and adjusting a driving voltage of the OLED according to the sensing signal.

In one embodiment, the measuring step is performed with a photo sensor coupled to the OLED.

In sum, the present invention, among other things, discloses an AMOLED display with each pixel incorporated with a photo sensor for optical feedback compensation so as to improve the performance of the AMOLED display.

The foregoing description of the exemplary embodiment of the invention has been presented only for the purposes of illustration and description and is not intended to be exhaustive or to limit the invention to the precise forms disclosed. Many modifications and variations are possible in light of the above teaching.

The embodiment and related configurations were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiment described therein.

What is claimed is:

1. A display, comprising:
   a substrate; and a plurality of pixels formed on the substrate and arranged in an array, each pixel comprising:
(a) a driving transistor and a read-out transistor spatially formed on the substrate, each transistor having a gate electrode, a drain electrode and a source electrode;
(b) an organic light emitting diode (OLED) having a cathode layer, an anode layer and an emissive layer formed between the cathode layer and the anode layer, and formed over the driving transistor and the read-out transistor such that the anode layer of the OLED is electrically connected to the source electrode of the driving transistor, and the OLED has a light emitting area defined between the driving transistor and the read-out transistor; and
(c) a photo sensor having a photosensitive layer formed between the anode layer of the OLED and the source electrode of the read-out transistor for receiving light emitted from the OLED, wherein the photosensitive layer is in direct contact with the anode layer of the OLED and defines a photo sensing area located in the light emitting area.

2. The display of claim 1, wherein the photosensitive layer is formed of a Si-rich dielectric material.

3. The display of claim 1, wherein the anode layer of the OLED is formed such that at least a portion that overlaps the photosensitive layer of the photo sensor is partially transparent to light emitted from the emissive layer of the OLED.

4. The display of claim 3, wherein the photo sensor is adapted for measuring brightness of an ambient light that is proportional to the light emitted from the OLED and generating a sensing signal corresponding to the measured brightness of the ambient light, wherein the sensing signal is utilized to adjust a driving voltage of the OLED accordingly.

5. The display of claim 4, wherein the OLED comprises a top-emitting OLED or a bottom-emitting OLED.

6. The display of claim 5, wherein the photo sensing area is not larger than the light emitting area.

7. The display of claim 1, wherein each of the driving transistor and the read-out transistor comprises an NMOS transistor or PMOS transistor.

8. The display of claim 7, wherein each of the driving transistor and the read-out transistor comprises a back channel etched (BCE) type thin film transistor (TFT), an IS type TFT, a coplanar type TFT, a bottom-gate type TFT, or a top-gate type TFT.

9. A display, comprising:
an active matrix organic light emitting diode (AMOLED) panel having a plurality of pixel arranged in an array, each pixel comprising:
(a) an organic light emitting diode (OLED) having a cathode electrically coupled to a first supply voltage, OVSS, a anode and an emissive layer formed between the cathode and the anode, wherein the OLED has a light emitting area;
(b) a driving circuit having:
(i) a first transistor having a gate, a drain electrically coupled to a second supply voltage, OVDD, and a source electrically coupled to the anode of the OLED;
(ii) a second transistor having a gate electrically coupled to a scan signal, Vscan(N), a drain electrode electrically coupled to the gate of the first transistor, and a source electrode electrically coupled to a data signal, Vdata; and
(iii) a storage capacitor electrically connected between the gate and the drain of the first transistor;

(c) a read-out transistor having a gate electrically coupled to a sensing control voltage, Vsense, a drain for outputting a sensing signal, Isense, and a source; and
(d) a photo sensor having a photosensitive layer formed between between the anode of the OLED and the source of the read-out transistor such that the photosensitive layer is located over the read-out transistor and in direct contact with the anode of the OLED, wherein the photo sensor has a photo sensing area located in the light emitting area.

10. The display of claim 9, wherein the photo sensor is adapted for measuring brightness of an ambient light that is proportional to light emitted from the OLED and generating the sensing signal Isense corresponding to the measured brightness of the ambient light, wherein the sensing signal Isense is utilized to adjust the data signal Vdata.

11. The display of claim 9, wherein the OLED comprises a top-emitting OLED or a bottom-emitting OLED.

12. The display of claim 9, wherein the first supply voltage OVSS and the second supply voltage OVDD are a negative supply voltage and a positive supply voltage, respectively.

13. The display of claim 9, wherein each of the first transistor, the second transistor and the read-out transistor comprises an NMOS transistor or PMOS transistor.

14. A display, comprising:
an active matrix organic light emitting diode (AMOLED) panel having a plurality of pixels arranged in an array, each pixel comprising:
(a) an organic light emitting diode (OLED) having a cathode electrically coupled to a first supply voltage, OVSS, and an anode electrically coupled to a second voltage, OVDD, wherein the OLED has a light emitting area;
(b) a photo sensor for measuring brightness of an ambient light that is proportional to light emitted from the OLED and generating a sensing signal corresponding to the measured brightness of the ambient light, wherein the photo sensor has a photosensitive layer formed in direct contact with the anode of the OLED, wherein the photo sensor has a photo sensing area located in the light emitting area, and wherein the sensing signal is utilized to adjust a driving voltage of the OLED accordingly;
(c) a first transistor having a gate, a drain electrically coupled to the second supply voltage, OVDD, and a source electrically coupled to the anode of the OLED;
(d) a second transistor having a gate electrically coupled to a scan signal, Vscan(N), a drain electrode electrically coupled to the gate of the first transistor, and a source electrode electrically coupled to a data signal, Vdata; and
(e) a storage capacitor electrically connected between the gate and the drain of the first transistor.

15. The display of claim 14, wherein each of the first transistor and the second transistor comprises an NMOS transistor or PMOS transistor.

16. The display of claim 14, wherein the data signal Vdata is adjustable so as to adjust the driving voltage of the OLED according to the sensing signal.

17. The display of claim 14, wherein the data signal Vdata is adjustable so as to adjust the driving voltage of the OLED according to the sensing signal.

18. A method of driving a display having an active matrix organic light emitting diode (AMOLED) panel having a plurality of pixels arranged in an array, each pixel comprising an organic light emitting diode (OLED) having a light emitting area defined between a driving transistor and a read-out transistor, comprising the steps of:

(a) measuring, by a photo sensor coupled to the OLED, brightness of an ambient light that is proportional to light emitted from the OLED so as to generate a sensing signal corresponding to the measured brightness of the ambient light, wherein the photo sensor has a photosensitive layer in direct contact with an anode layer of the OLED, wherein the photo sensor has a photo sensing area located in the light emitting area; and (b) adjusting a driving voltage of the OLED according to the sensing signal.

* * * * *